United States Patent
Choi et al.

(10) Patent No.: US 7,218,257 B2
(45) Date of Patent: May 15, 2007

(54) APPARATUS AND METHOD FOR VARIABLE LENGTH CODING

(75) Inventors: Byung-sun Choi, Gunpo-si (KR); Kang-wook Chun, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/901,302

(22) Filed: Jul. 29, 2004

(65) Prior Publication Data

US 2005/0035888 A1    Feb. 17, 2005

(30) Foreign Application Priority Data

Jul. 29, 2003    (KR) .................... 10-2003-0052394

(51) Int. Cl.
*H03M 7/40* (2006.01)

(52) U.S. Cl. .................. 341/67; 386/104; 345/473

(58) Field of Classification Search ............. 341/67; 345/473; 386/104
See application file for complete search history.

(56) References Cited

U.S. PATENT DOCUMENTS

| | | | |
|---|---|---|---|
| 3,675,211 A * | 7/1972 | Raviv | 341/67 |
| 5,570,197 A * | 10/1996 | Boon | 386/46 |
| 5,781,134 A * | 7/1998 | Son | 341/67 |
| 5,821,886 A * | 10/1998 | Son | 341/67 |
| 5,821,887 A * | 10/1998 | Zhu | 341/67 |
| 5,831,557 A * | 11/1998 | Handley | 341/67 |
| 6,014,095 A * | 1/2000 | Yokoyama | 341/67 |
| 6,147,629 A * | 11/2000 | Wood | 341/67 |
| 6,211,801 B1 * | 4/2001 | Girod | 341/67 |
| 6,275,239 B1 * | 8/2001 | Ezer et al. | 345/473 |
| 6,353,703 B1 * | 3/2002 | Tatsumi et al. | 386/104 |
| 6,445,314 B1 * | 9/2002 | Zhang et al. | 341/67 |
| 6,587,058 B1 * | 7/2003 | Deeley et al. | 341/67 |
| 2002/0011943 A1 * | 1/2002 | Deeley et al. | |
| 2003/0108103 A1 * | 6/2003 | Natsume | |

FOREIGN PATENT DOCUMENTS

| | | |
|---|---|---|
| KR | 2001-83063 | 8/2001 |
| KR | 2002-0003063 A | 1/2002 |

* cited by examiner

*Primary Examiner*—Jean Bruner Jeanglaude
(74) *Attorney, Agent, or Firm*—Sughrue Mion, PLLC

(57) ABSTRACT

An apparatus and method for variable length coding are provided. The apparatus for variable length coding includes a central processing unit which has a software module programmed in advance for variable length coding in a predetermined method, performs variable length coding of input symbol data by using the software module, and generates variable length code information. The apparatus further includes a bitstream processor which is a separate processor receiving the variable length code information from the central processing unit and generating a bitstream. According to the apparatus and method, modification or addition of a VLC table can be more easily performed through downloading software such that new video data coding standards can be easily supported. Also, by implementing the bitstream processor as a separate dedicated processor and thus implementing variable length coding as a software module, load to the central processing unit is reduced and high speed processing is enabled.

10 Claims, 6 Drawing Sheets

| VARIABLE LENGTH CODE | RUN | LEVEL |
|---|---|---|
| 10 | END OF BLOCK | |
| 1S | 0 | 1 |
| 011S | 1 | 1 |
| ⋮ | ⋮ | ⋮ |
| 0000 111S | 8 | 1 |
| 0000 101S | 9 | 1 |

APPARATUS AND METHOD FOR VARIABLE LENGTH CODING

BACKGROUND OF THE INVENTION

This application claims the priority of Korean Patent Application No. 2003-52394, filed on Jul. 29, 2003, in the Korean Intellectual Property Office, the disclosure of which is incorporated herein in its entirety by reference.

1. Field of the Invention

The present invention relates to video data coding, and more particularly, to an apparatus and method for variable length coding.

2. Description of the Related Art

As leading international standards for video data coding, there are MPEG-1, MPEG-2, MPEG-4 and H.26X. In order to efficiently compress video data, these standards use coding technologies, such as discrete cosine transform (DCT) using spatial correlation of video data, motion estimation/motion compensation using temporal correlation, and variable length coding (VLC) using occurrence probabilities of data.

FIG. 1 is a block diagram of a prior art video data coder. Referring to FIG. 1, the video data coder includes a DCT transformer 1, a quantizer (Q) 2, a VLC coder (VLC) 3, an inverse quantizer (IQ) 4, an inverse DCT transformer (IDCT) 5, a motion compensator (MC) 6, a motion estimator (ME) 7, and a frame memory 8.

The video data coder as shown in FIG. 1 is manufactured in the form of a dedicated chip by a chip manufacturer, or is implemented by software so that it can be executed by an apparatus such as a computer. Recently, video data coders have been developed in the form of a system-on-chip with an embedded central processing unit (CPU). That is, with respect to characteristics of each of coding steps in the entire video data coding process, some coding steps are implemented as dedicated hardware modules, and other coding steps are implemented as dedicate software modules such that a video data coder can be implemented in the form of a chip integrating hardware and software.

Due to the characteristics of variable length coding, preferably, a module for variable length coding is implemented by a software module so that flexibility can be provided. This is because this flexibility makes modification, update, or addition of a VLC table easier whe in order to support new video data coding standards, the contents of a VLC table used for variable length coding should be modified or a new VLC table should be added. If the module for variable length coding is implemented as a hardware module, the hardware module itself should be newly designed for modification, update, or addition of the VLC table such that time, efforts and expenses increase.

Meanwhile, if the entire variable length coder is implemented by a software module, there is a problem that when the performance of the CPU operating the software module is lowered, a situation where real time data processing is impossible can occur.

SUMMARY OF THE INVENTION

The present invention provides a variable length coding apparatus and method capable of flexibly handling modification or addition of a VLC table for variable length coding, and processing data at a higher speed.

According to an aspect of the present invention, there is provided an apparatus variable length coding (VLC) including: a central processing unit which has a software module programmed in advance for variable length coding in a predetermined method, performs variable length coding of input symbol data by using the software module, and generates variable length code information; and a bitstream processor which is a separate processor receiving the variable length code information from the central processing unit and generating a bitstream.

According to another aspect of the present invention, there is provided a method for VLC including: a central processing unit having a software module programmed in advance for variable length coding, performing variable length coding of input symbol data by using the software module and generating variable length code information; and a bitstream processor implemented separately as a hardware element, receiving the variable length code information and generating a bitstream.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
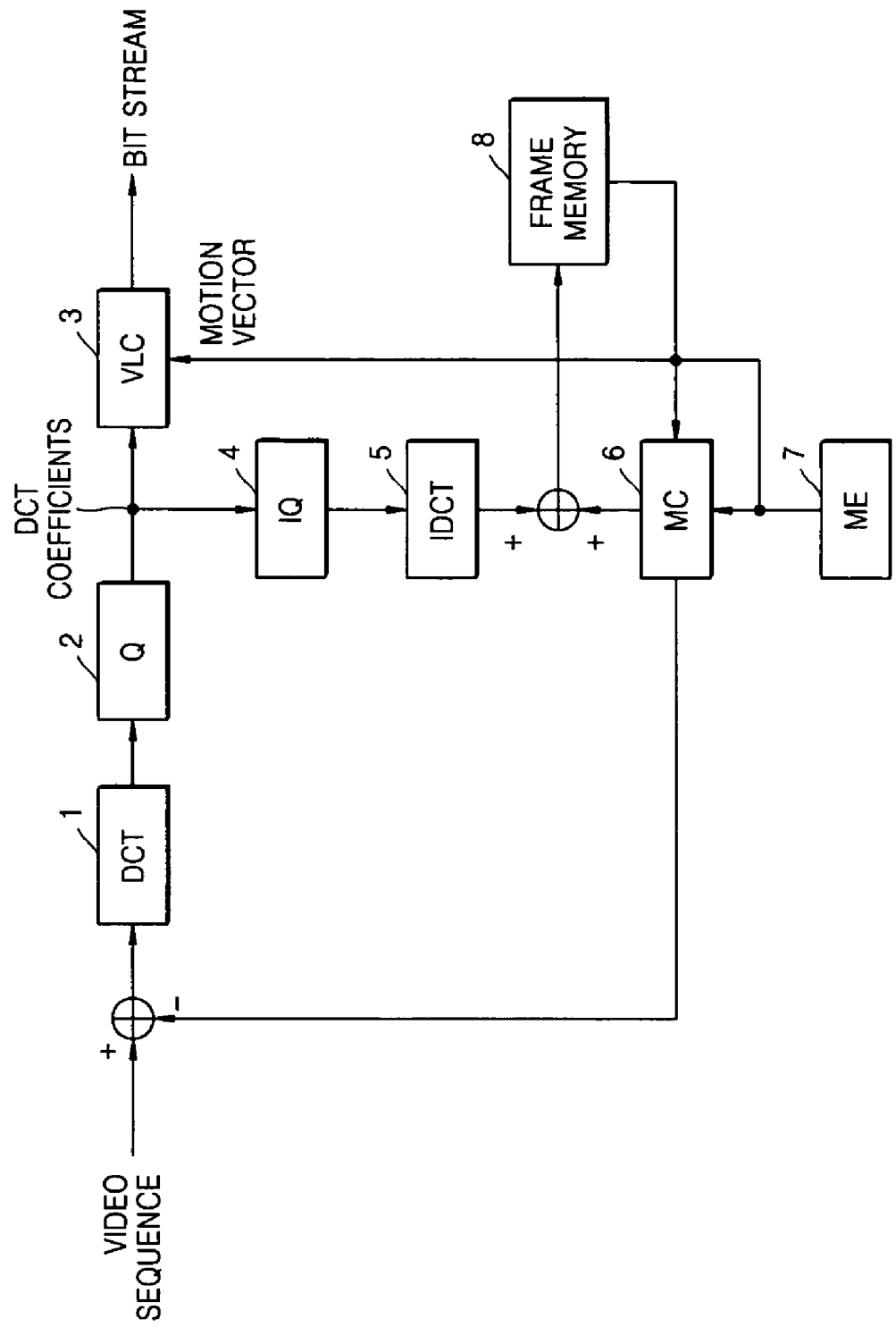
FIG. 1 is a block diagram of a prior art video data coder.
Figure 2:
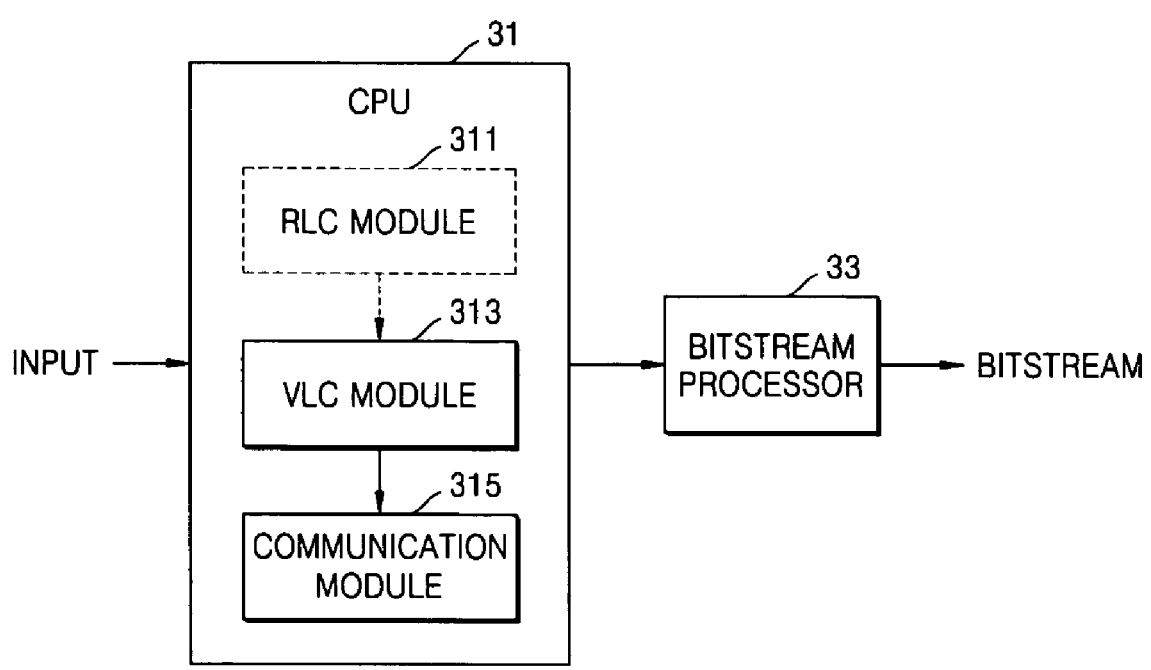
FIG. 2 is a block diagram of a preferred embodiment of a variable length coding apparatus according to the present invention.

Referring to FIG. 2, a variable length coding apparatus according to the present invention includes a central processing unit (CPU) 31 and a bitstream processor 33.

The CPU 31 includes a run-length coding (RLC) module 311 which is a software module for RLC, a variable length coding (VLC) module 313 which is a software module for VLC, and a communication module 315 which is a software module for communication with the bitstream processor 33. Variable length coding using a predetermined VLC table is implemented by a software module programmed in advanced in the CPU 31. The CPU 31 generates variable code information by using the VLC module 313, and transmits the information to the bitstream processor 33. The CPU 31 may not have the RLC module 311 if RLC is performed in a quantizer (not shown).

The variable length coding apparatus according to the present invention may be included inside a video data coder (not shown) having a structure similar to that shown in FIG.

1. In addition to variable length coding according to the present invention, the CPU 31 also performs control of the operation of the entire video data coder, or coding of audio data.

The bitstream processor 33 receives variable length code information transmitted by the CPU 31 according to a predetermined data communication method, and generates and outputs a bitstream. Variable length coding is performed by the software module programmed in advance in the CPU 31. However, by considering that a bitstream processor generally performs a large amount of calculation to generate a bitstream and is a general purpose device that can be identically used in any type of video data coding standards, the bitstream processor 33 in the present invention is not implemented by a software module, but as a dedicate processor separate from the CPU 31.

Figure 6A:
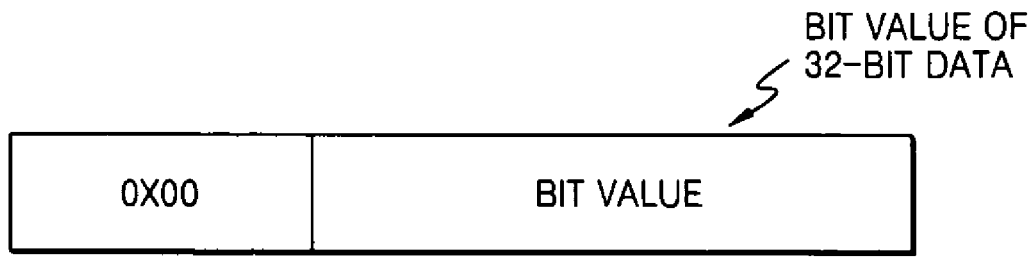
FIGS. 6A-6C are diagrams showing embodiments of variable length code information according to the data structure shown in FIG. 5.
Figure 6B:
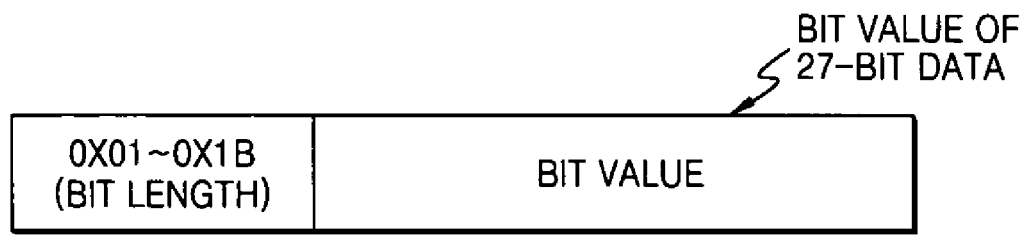
Figure 6C:
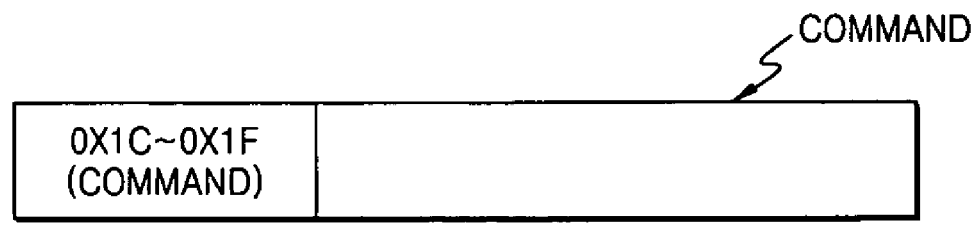
Figure 7:
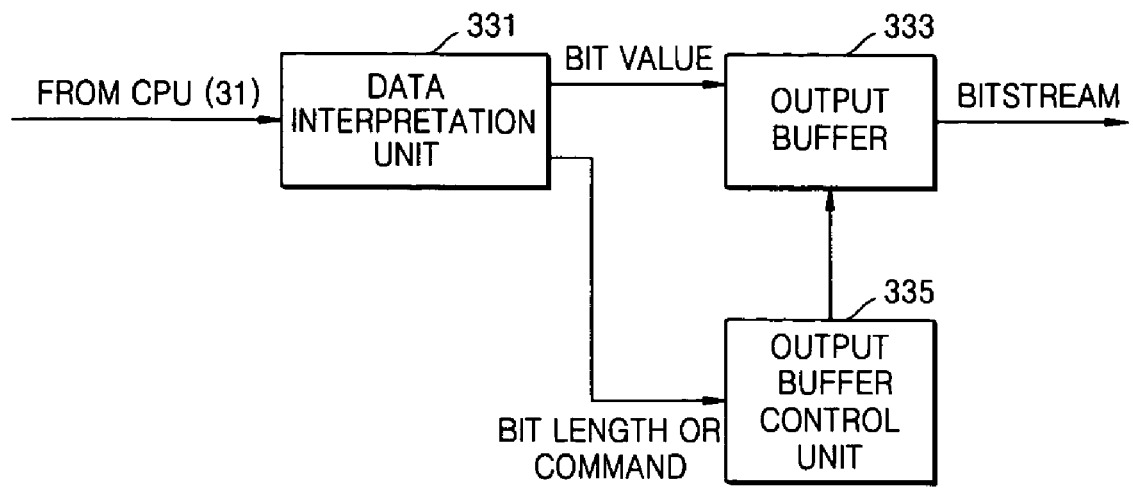
FIG. 7 is a block diagram of an embodiment of a bitstream processor.

FIG. 7 is a block diagram of an embodiment of a bitstream processor. The bitstream processor 33 receiving variable length code information having the data structure as shown in FIGS. 5 and 6A-6C from the CPU 31, preferably has a structure as shown in FIG. 7 so as to process the received variable length code information, and generate a bitstream.

Referring to FIG. 7, the bitstream processor 33 includes a data interpretation unit 331 which receives variable length code information from the CPU 31, and outputs first information and second information included in the input variable length code information, to an output buffer control unit 335 and an output buffer 333, respectively; the output buffer 333 with a predetermined length; and the output buffer control unit 335 which controls the output buffer 333 according to the input first information input from the data interpretation unit 331.

Based on the structure of the VLC apparatus according to the present invention, an embodiment of the VLC method according to the present invention will now be explained.

Figure 3:
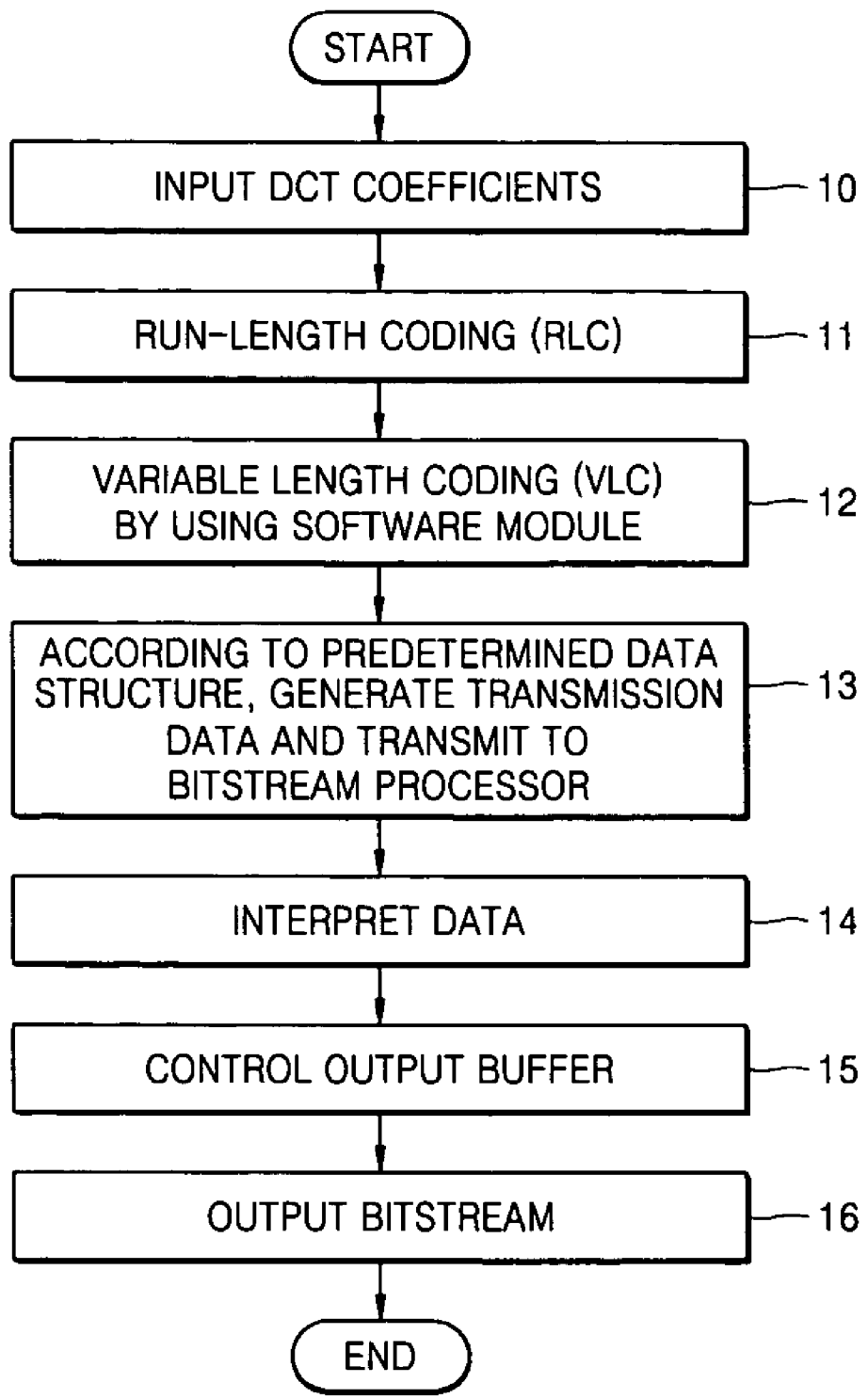
FIG. 3 is a flowchart of the steps performed by a preferred embodiment of a variable length coding method according to the present invention.

FIG. 3 is a flowchart of the steps performed by a preferred embodiment of a variable length coding method according to the present invention.

The CPU 31 receives DCT coefficients in step 10. DCT coefficients that are input to the CPU 31 for variable length coding are mostly quantized coefficients. Also, data that are input to the CPU 31 for variable length coding may include motion vectors in addition to DCT coefficients.

By driving the RLC module 311, the CPU 31 performs run-length coding of the input DCT coefficients in step 11. Run-length coding is a process to obtain runs and levels by continuously receiving DCT coefficients. Run is the number of continuous 0's and a level is the value of a DCT coefficient that is not 0. A run and a level are altogether referred to as a symbol.

As described above, when run-length coding is performed in a quantizer (not shown), that is, when runs and levels are input to the CPU 31, the CPU 31 does not need to perform step 11.

Also, when a motion vector is input to the CPU 31, the CPU performs the following instead of run-length coding in step 11. Based on motion vector data input to the CPU 31, according to a motion vector prediction method defined as a standard, such as MPEG-1, MPEG-2, MPEG-4, and H.26X, the prediction value of a motion vector currently desired to be coded is obtained and then, the difference between the predicted motion vector and the motion vector currently desired to be coded is obtained.

After run-length coding, the CPU 31 performs variable length coding by running the VLC module 313 in step 12.

Figures 4, 5:
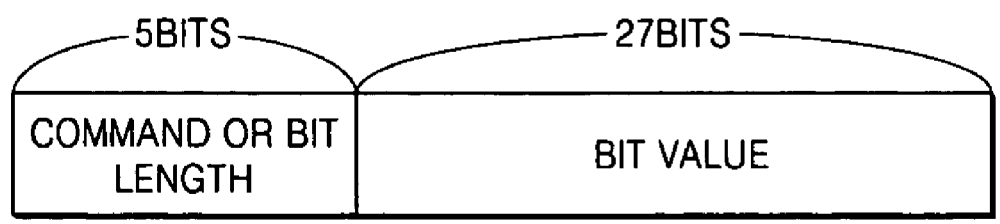
FIG. 4 is an example of a VLC table for variable length coding.
FIG. 5 is a diagram showing a data structure for communication between a central processing unit and a bitstream processor according to the present invention.

FIG. 4 is an example of a VLC table for variable length coding. The VLC table shown in FIG. 4 is a table used for variable length coding of DCT coefficients of an intra block complying with the MPEG-2 standard.

The CPU 31 drives the VLC module 313 programmed in advance, and determines a variable length code corresponding to an input run and level or an input motion vector difference. For example, if the run is 1 and the level is 1, the variable length code is "011s". Here, "s" denotes the sign of the level. That is, if "s" is 1, the level is a positive number, and if "s" is 0, the level is a negative number.

After variable length coding, the CPU 31 drives the communication module 315, generates data to be transmitted to the bitstream processor 33 in a predetermined data structure, and transmits the data to the bitstream processor 33 in step 13.

In the present embodiment, for better communication between the CPU 31 and the bitstream processor 33, a separate data structure is defined.

FIG. 5 is a diagram showing a data structure for communication between the CPU 31 and the bitstream processor 33 according to the present invention. Referring to FIG. 5, the CPU 31 transmits 32-bit variable length code information to the bitstream processor 33. The variable length code information includes first information indicating the bit length of a variable length code, or a command to command the bitstream processor 33 to perform a predetermined operation, and second information indicating the bit value of a variable length code having the bit length of a variable length code included in the first information. Referring to FIG. 5, 5 bits are allocated to the first information and the remaining 27 bits are allocated to the second information.

After a variable length code corresponding to the run and level or the motion vector difference input is determined in the step 12, the variable length code itself is not transmitted to the bitstream processor 33, but the bit value and bit length of the determined variable code are included in 32-bit variable length code information, and this information is transmitted to the bitstream processor 33. If the variable length code is "0000 111s", the bit value of the variable length code is "111s" and the bit length is "8".

FIGS. 6A-6C are diagrams showing embodiments of variable length code information according to the data structure shown in FIG. 5. The first information with allocated 5 bits can express the numbers from 0 to 31. Accordingly, in the embodiments shown in FIGS. 6A–6C, much information can be expressed according to the value of the first information.

FIG. 6A shows a case where 32-bit variable length code information means the bit value of one variable length code when the front 5 bits forming the first information are all 0's; that is, when the first information is integer 0. In the case of a predetermined code such as a start code, all bits of the code, except some low-order bits, have value 0. Accordingly, the length of a variable length code is not needed to be expressed such that 32-bit variable length code information is made to express the bit value of one variable length code.

FIG. 6B shows a case where when the 5 bits forming the first information have any integer value from 1 to 27, it indicates that the first information indicates the length of one variable length code, and the second information is the bit value of the variable length code corresponding to the first information.

FIG. 6C shows a case where when the 5 bits forming the first information have any integer value from 28 to 31, it indicates that the first information indicates a command to command the bitstream processor 33 to perform a predetermined operation. The second information may have no information, or may include an arbitrary bit value, but if the first information is confirmed to be a command, the bitstream processor 33 neglects the second information.

As the command, there are byte align, flush, and so on. If a byte align command is received, the output buffer control unit 335 arranges data filled in the output buffer 333, in units of 8 bits. For example, when data "0011 01" are stored in the output buffer 333 and if the byte align command is received, the output buffer control unit 335 arranges the data in the output buffer 333, into one byte of "0011 0100".

The flush command commands the output buffer 33 to output all stored data even when the output buffer 33 is not full.

The data interpretation unit 331 of the bitstream processor 33 receiving the variable length code information having the data structure as shown in FIGS. 5 and 6A–6C transmitted by the CPU 31, interprets the received data in step 14. That is, the data interpretation unit 331 interprets the 32-bits-long variable code information received from the CPU 31, and outputs the first information and the second information to the output buffer control unit 335 and the output buffer 333, respectively.

The output buffer control unit 335 controls the output buffer 333 according to the first information input from the data interpretation unit 331 in step 15.

Figure 8A:
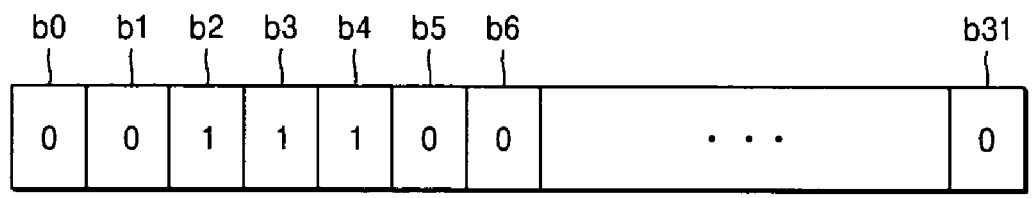
FIGS. 8A and 8B are diagrams explaining an operation to control an output buffer.
Figure 8B:
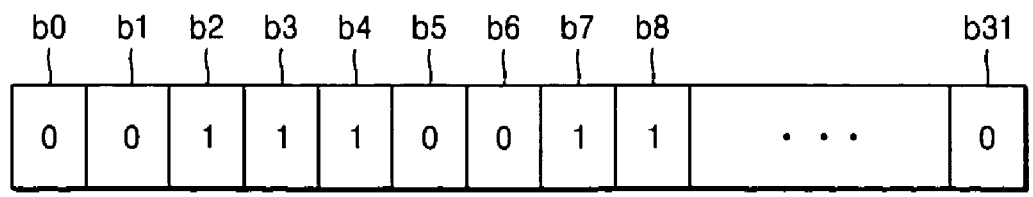

FIGS. 8A and 8B are diagrams explaining an operation for controlling the output buffer 333. The output buffer is 32 bits long. The 32 bits of the output buffer 33 are all set to 0 in the initialization. If variable length code information including the bit value of "111" and the bit length of "5" is first received by the data interpretation unit 331, the bit value of "111" is input to the output buffer 333 and the bit length of "5" is input to the output buffer control unit 335.

According to the bit length of "5", the output buffer control unit 335 controls the output buffer 333 such that bit value "00111" is stored in the location from b0 through b4 as shown in FIG. 8A. In the locations from b5 to b31, initial value 0's are still stored without change.

If variable length code information including the bit value of "11" and the bit length of "4" is secondly received by the data interpretation unit 331, the bit value of "11" is input to the output buffer 333 and the bit length of "4" is input to the output buffer control unit 335.

According to the bit length of "4", the output buffer control unit 335 controls the output buffer 333 such that bit value "0011" is stored in the location from b5 through b8, which follows the location from b0 through b4 already storing "001111", as shown in FIG. 8B. In the locations from b9 to b31, initial value 0's are still stored without change.

IF 32 bits long data are filled in the output buffer 333, a bitstream is output in step 16.

According to the present invention as described above, variable length coding is performed by a software module. Thus, when a VLC table used for variable length coding should be modified, or a new VLC table should be added, modification or addition of a VLC table can be more easily performed through downloading software such that new video data coding standards can be easily supported. Also, by implementing the bitstream processor as a separate dedicated processor and thus implementing variable length coding as a software module, load to the central processing unit is reduced and high speed processing is enabled.

What is claimed is:

1. An apparatus for variable length coding comprising:
a central processing unit (CPU) including a software module programmed for variable length coding, the CPU performing variable length coding of input symbol data by using the software module, and generating variable length code information; and
a bitstream processor which receives the variable length code information from the CPU and generates a bitstream,
wherein the variable length coding comprises determining a variable length code corresponding to the input symbol data,
wherein the variable length code information comprises first information indicating length of the variable length code or a command to command the bitstream processor to perform a predetermined operation, and second information indicating a bit value of the variable length code and
wherein the bitstream processor is configured separately from the CPU and generates the bitstream from the second information according to the first information.

2. The apparatus of claim 1, wherein the software module for variable length coding programmed in the CPU is capable of being updated or modified.

3. The apparatus of claim 1, wherein when bit values of the first information are all 0's, the entire bits forming the variable length code information indicate a data bit value of the variable length code.

4. The apparatus of claim 1, wherein according to bit values of the first information, the first information indicates the bit length of the variable length code, or the command to command the bitstream processor to perform the predetermined operation.

5. The apparatus of claim 1 wherein the bitstream processor comprises:
a data interpretation unit which receives the variable length code information from the CPU, and interprets the received variable length code information;
an output buffer; and
a buffer control unit which controls the output buffer,
wherein the data interpretation unit outputs the first information and the second information included in the received variable length code information, to the output buffer control unit and the output buffer, respectively, and the output buffer control unit controls the output buffer according to the first information.

6. A method for variable length coding, the method comprising:
at a central processing unit (CPU), performing variable length coding of input symbol data using a software module of the CPU and generating variable length code information; and
receiving at a bitstream processor the variable length code information and generating a bitstream,
wherein the variable length coding comprises determining a variable length code corresponding to the input symbol data,
wherein the variable length code information comprises first information indicating length of the variable length code or a command to command the bitstream processor to perform a predetermined operation, and second information indicating a bit value of the variable length code, and
wherein the bitstream processor is configured separately from the CPU and generates the bitstream from the second information according to the first information.

7. The method of claim 6, wherein when bit values of the first information are all 0's, the entire bits forming the variable length code information indicate a data bit value of the variable length code.

8. The method of claim 6 wherein according to bit values of the first information, the first information indicates the bit length of the variable length code, or the command to command the bitstream processor to perform the predetermined operation.

9. The method of claim 6, wherein generating the bitstream comprises:
receiving the variable length code information from the CPU, and outputting the first information and the second information included in the received variable length code information, to an output buffer control unit and an output buffer, respectively; and
controlling the output buffer according to the first information.

10. The method of claim 6, wherein the software module for variable length coding programmed in the CPU is capable of being updated or modified.

* * * * *